(12) United States Patent
Terasawa

(10) Patent No.: US 11,402,425 B2
(45) Date of Patent: Aug. 2, 2022

(54) FAILURE DETECTOR CIRCUIT, FAILURE DETECTION SYSTEM, AND METHOD

(71) Applicants: Kabushiki Kaisha Toshiba, Tokyo (JP); Toshiba Electronic Devices & Storage Corporation, Tokyo (JP)

(72) Inventor: Naoei Terasawa, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 154 days.

(21) Appl. No.: 17/005,750

(22) Filed: Aug. 28, 2020

(65) Prior Publication Data

US 2021/0263095 A1    Aug. 26, 2021

(30) Foreign Application Priority Data

Feb. 26, 2020    (JP) .............................. JP2020-030088

(51) Int. Cl.
*G01R 31/28*    (2006.01)
*H02H 7/22*    (2006.01)
*H02H 1/00*    (2006.01)

(52) U.S. Cl.
CPC ......... *G01R 31/282* (2013.01); *H02H 1/0007* (2013.01); *H02H 7/22* (2013.01)

(58) Field of Classification Search
CPC ... G05B 19/054; G06F 11/1048; G01R 31/28; G01R 31/282; G01R 31/31703; G01R 31/31707; G01R 31/3185; H01L 21/822; H01L 27/04; H02H 1/00; H02H 1/0007; H02H 7/22
See application file for complete search history.

(56) References Cited

U.S. PATENT DOCUMENTS

2006/0242483 A1* 10/2006 Werner .................. G11C 29/50
                                                                714/714
2021/0286005 A1* 9/2021 Suina ............... G01R 31/31724

FOREIGN PATENT DOCUMENTS

JP    3349991 B2    9/2002
JP    2003-098223 A    4/2003
JP    2011-146903 A    7/2011

* cited by examiner

*Primary Examiner* — Jared Fureman
*Assistant Examiner* — Nicolas Bellido
(74) *Attorney, Agent, or Firm* — Allen & Overy LLP

(57) ABSTRACT

A failure detector circuit of one embodiment acquires a first signal while transmitted from a first circuit to a second circuit and acquires a second signal while transmitted from the second circuit to a third circuit. The second circuit is located between the first circuit and the third circuit and transmits, to the third circuit, as the second signal, the first signal or a third signal having a given fixed state. The failure detector circuit outputs a fourth signal indicating detection or non-detection of a failure in the second circuit, in accordance with the first signal and the second signal.

20 Claims, 5 Drawing Sheets

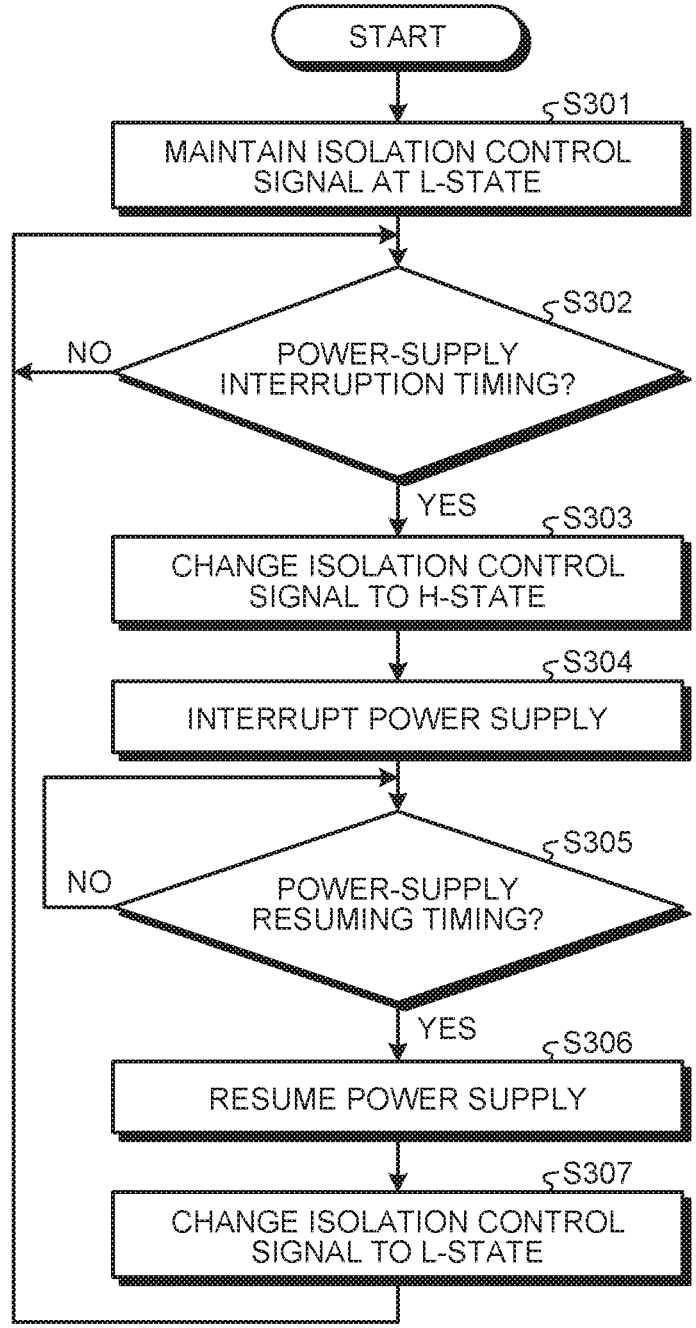

FAILURE DETECTOR CIRCUIT, FAILURE DETECTION SYSTEM, AND METHOD

CROSS-REFERENCE TO RELATED APPLICATIONS

This application is based upon and claims the benefit of priority from Japanese Patent Application No. 2020-030088, filed on Feb. 26, 2020; the entire contents of which are incorporated herein by reference.

FIELD

Embodiments described herein relate generally to a failure detector circuit, a failure detection system, and a method.

BACKGROUND

Traditionally, to conduct an in-system self-test of a preceding circuit module of two circuit modules or to be able to interrupt power supply to the preceding circuit module, an isolation circuit module may be set between the two circuit modules.

Such an isolation circuit module typically functions to transmit an output signal from the preceding circuit module to a following circuit module in normal operation. During the in-system self-test or while the power supply to the preceding circuit module is being interrupted, the isolation circuit module transmits, to the following circuit module, a signal having a given fixed state in place of the output signal of the preceding circuit module.

BRIEF DESCRIPTION OF THE DRAWINGS

FIG. 5 is a flowchart illustrating an exemplary operation of a power control circuit according to the second embodiment.

DETAILED DESCRIPTION

According to one embodiment, in general, a failure detector circuit acquires a first signal while transmitted from a first circuit to a second circuit and acquires a second signal while transmitted from the second circuit to a third circuit. The second circuit is located between the first circuit and the third circuit and transmits, to the third circuit, as the second signal, the first signal or a third signal having a given fixed state. The failure detector circuit outputs a fourth signal indicating detection or non-detection of a failure in the second circuit, in accordance with the first signal and the second signal.

The failure detector circuit of an embodiment may be incorporated in any system. For example, the failure detector circuit of an embodiment may be incorporated in a system large-scale integration (LSI) or a micro-control unit (MCU). Exemplary embodiments of a failure detector circuit, a failure detection system, and a method will be explained below in detail with reference to the accompanying drawings. Such embodiments are presented for illustrative purpose only and are not intended to limit the scope of the present invention.

First Embodiment

Figure 1:
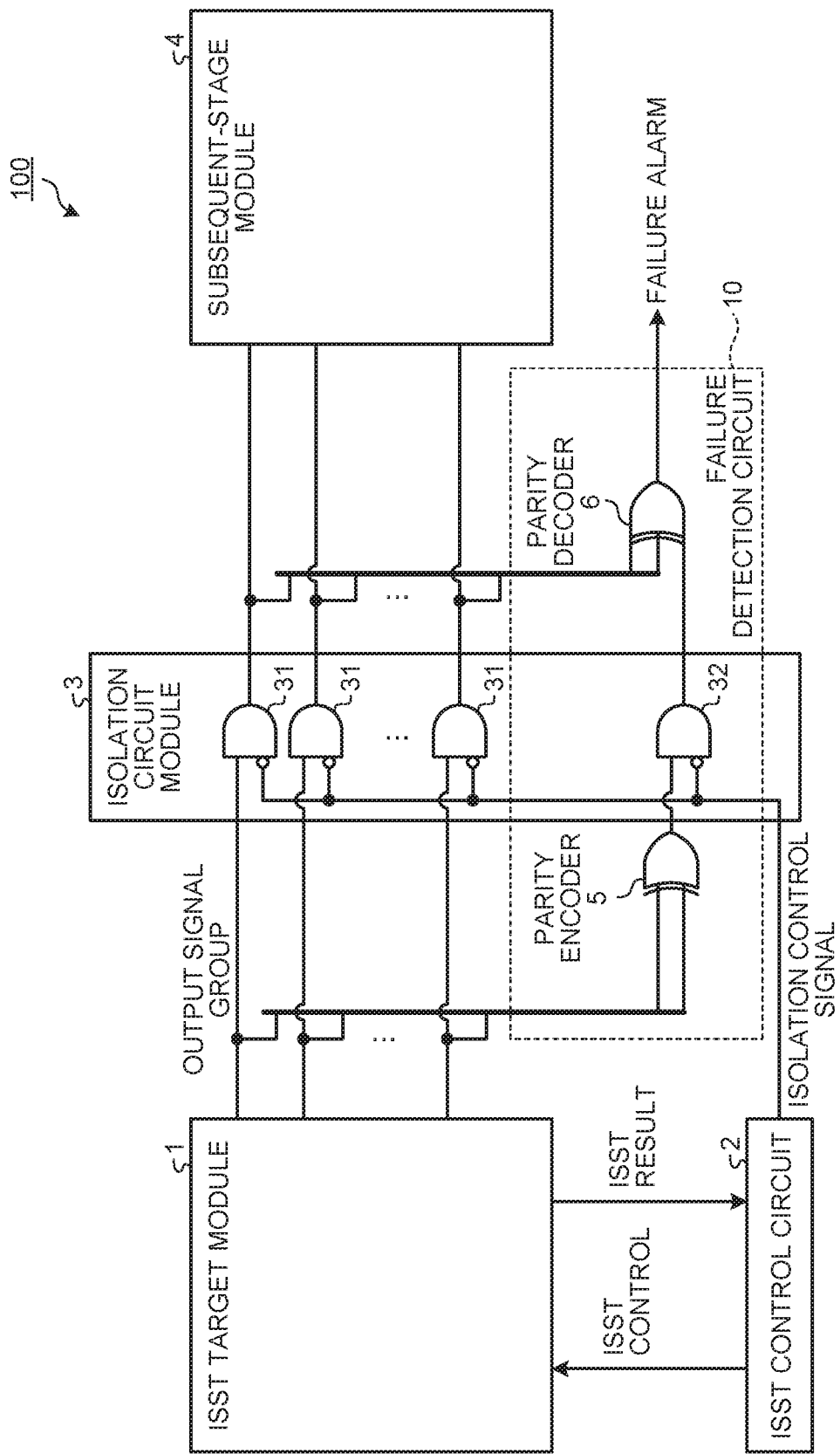
FIG. 1 is a schematic diagram illustrating an exemplary system configuration incorporating a failure detector circuit according to a first embodiment.

FIG. 1 is a schematic diagram illustrating an exemplary system configuration incorporating a failure detector circuit according to a first embodiment. As illustrated in FIG. 1, a system 100 includes an in-system self-test (ISST) target module 1, an ISST control circuit 2, an isolation circuit module 3, a subsequent-stage module 4, a parity encoder 5, and a parity decoder 6.

The ISST target module 1 corresponds to a first circuit. The isolation circuit module 3 corresponds to a second circuit. The subsequent-stage module 4 corresponds to a third circuit. The ISST control circuit 2 corresponds to a seventh circuit. The system 100 corresponds to a failure detection system.

The ISST target module 1 can be subject to an in-system self-test (hereinafter, referred to as ISST). The ISST target module 1 is exemplified by a logic circuit such as a timer circuit. The ISST target module 1 is not limited to the timer circuit. The ISST target module 1 can be any circuitry.

The ISST target module 1 can output one or more output signals. Herein, the ISST target module 1 serves to output a group of 1-bit output signals, by way of example. The output signal group output from the ISST target module 1 corresponds to a first signal.

The ISST control circuit 2 serves to conduct an ISST of the ISST target module 1. For example, the ISST control circuit 2 generates and transmits a test pattern to the ISST target module 1 as an ISST control signal. The ISST control circuit 2 then receives an ISST result which is an operation of the ISST target module 1 in accordance with the test pattern, and determines whether or not the operation matches with an expected operation.

During non-execution of the ISST, the ISST control circuit 2 sets the level of an isolation control signal to a first state. During the ISST, the ISST control circuit 2 sets the level of the isolation control signal to a second state different from the first state.

The first state is defined as a low (L) state while the second state is defined as a high (H) state, as an example.

The subsequent-stage module 4 is located subsequent to the ISST target module 1.

The output signals of the ISST target module 1 vary in level during the ISST differently from during normal operation, that is, during no execution of the ISST. Such a difference in variation in level of the output signal group may cause the subsequent-stage module 4 to malfunction.

In view of this, the isolation circuit module 3 is placed between the ISST target module 1 and the subsequent-stage module 4. During the ISST, the isolation circuit module 3 outputs, to the subsequent-stage module 4, a signal group with a given fixed state in place of the output signal group of the ISST target module 1, to prevent the subsequent-stage module 4 from malfunctioning. As a result, the subsequent-stage module 4 can be prevented from receiving a signal exhibiting a different variation from during the normal operation.

The isolation circuit module 3 includes a plurality of first isolation circuits 31 and a second isolation circuit 32. The first isolation circuits 31 are correspondent to the signals of the output signal group from the ISST target module 1, respectively.

While the isolation control signal exhibits the first state, the first isolation circuits 31 transmit the first signal, that is, the output signal group of the ISST target module 1, to the subsequent-stage module 4. While the isolation control signal exhibits the second state, the first isolation circuits 31 transmit, to the subsequent-stage module 4, a signal group having a given fixed state, in place of the output signal group of the ISST target module 1.

The output signal group of the first isolation circuits 31 corresponds to a second signal. The signal group with a given fixed state, output from the first isolation circuits 31 while the isolation control signal exhibits the second state, corresponds to a third signal.

Herein, the third signal is fixed to the L-state, as an example. That is, in response to the isolation control signal having the second state, the first isolation circuits 31 output a signal group having the L-state, in place of the output signal group of the ISST target module 1.

For that purpose, each of the first isolation circuits 31 includes an AND circuit. The AND circuit receives, at one of two input terminals, a corresponding one of the output signal group of the ISST target module 1. The AND circuit receives, at the other input terminal, a negation of the isolation control signal.

As configured above, when the isolation control signal exhibits the first state, that is, L-state, each first isolation circuit 31 can transmit, to the subsequent-stage module 4, a corresponding one of the output signal group of the ISST target module 1. When the isolation control signal exhibits the second state, that is, H-state, each first isolation circuit 31 transmits, to the subsequent-stage module 4, a signal having the L-state fixed.

The configuration of each first isolation circuit 31 can be appropriately modified depending on the configuration of the isolation control signal or the third signal.

The parity encoder 5, the second isolation circuit 32, and the parity decoder 6 constitute a failure detector circuit 10 of the first embodiment.

To detect a failure in the isolation circuit module 3, the failure detector circuit 10 acquires, in order, a signal group while transmitted from the ISST target module 1 to the isolation circuit module 3 and acquires as a signal group while transmitted from the isolation circuit module 3 to the subsequent-stage module 4. The failure detector circuit 10 then outputs a failure alarm signal indicating detection or non-detection of a failure in the isolation circuit module 3, according to the acquired signal groups.

An output destination of the failure alarm signal is set optionally. For example, the system 100 includes a terminal connected to the wiring for a failure alarm signal. Thus, devices outside the system 100 can recognize occurrence or non-occurrence of a failure in the isolation circuit module 3 by monitoring the level of the terminal. Alternatively, the failure alarm signal is connected to a central operation unit (CPU), and the CPU recognizes occurrence or non-occurrence of a failure in the isolation circuit module 3 from the failure alarm signal. After recognizing a failure in the isolation circuit module 3, the CPU writes the event to log data. This is merely exemplary. The failure alarm signal can be optionally dealt with.

The parity encoder 5 corresponds to a fourth circuit. The second isolation circuit 32 corresponds to a fifth circuit. The parity decoder 6 corresponds to a sixth circuit. The failure alarm signal corresponds to a fourth signal.

The parity encoder 5 receives the output signal group of the ISST target module 1 and outputs a signal corresponding to parity of the output signal group. Specifically, the parity encoder 5 includes an XOR circuit to which the output signal group of the ISST target module 1 is input. The configuration of the parity encoder 5 is not limited thereto. The parity encoder 5 can be optionally configured as long as the parity encoder 5 can output a signal corresponding to the parity of the output signal group of the ISST target module 1.

When the isolation control signal exhibits the first state, that is, L-state, the second isolation circuit 32 transmits the output signal of the parity encoder 5 to the parity decoder 6 as it is. When the isolation control signal exhibits the second state, that is, H-state, the second isolation circuit 32 transmits, to the parity decoder 6, a signal having a given fixed state, in place of the output signal of the parity encoder 5.

Herein, in response to the isolation control signal having the second state, the second isolation circuit 32 outputs a signal having the L-state fixed, as an example.

For that purpose, the second isolation circuit 32 includes an AND circuit specifically. The AND circuit receives, at one of two input terminals, the output signal from the parity encoder 5. The AND circuit receives, at the other input terminal, a negation of the isolation control signal therefrom.

As configured above, when the isolation control signal exhibits the first state, that is, L-state, the second isolation circuit 32 transmits the output signal of the parity encoder 5 to the parity decoder 6. When the isolation control signal exhibits the second state, that is, H-state, the second isolation circuit 32 transmits, to the parity decoder 6, a signal having the L-state fixed.

The configuration of the second isolation circuit 32 can be appropriately modified depending on the configuration of the isolation control signal or the configuration of the output signal of the second isolation circuit 32 when the isolation control signal exhibits the second state.

The parity decoder 6 calculates parity between the second signals from all the first isolation circuits 31 and the output signal of the second isolation circuit 32, to output the calculated parity as the failure alarm signal serving to indicate whether or not the isolation circuit module 3 has a failure.

That is, the parity decoder 6 is configured to compare a signal, corresponding to the parity of the second signal group from all the first isolation circuits 31, and the output signal of the second isolation circuit 32. When both the signals are found to be logically equivalent, the parity decoder 6 sets the level of the failure alarm signal to the L-state. When both the signals are found to be not logically equivalent, the parity decoder 6 sets the level of the failure alarm signal to the H-state.

For example, during no execution of the ISST, the isolation control signal is set to the L-state. Thus, each first isolation circuit 31 outputs the output signal of the ISST target module 1 as it is. The parity encoder 5 calculates the signal corresponding to the parity of the output signal group of the ISST target module 1 before the output signal group passes through the isolation circuit module 3. The second isolation circuit 32 outputs the signal calculated by the parity encoder 5. That is, the parity decoder 6 can compare the signals corresponding to the parity of the output signal group of the ISST target module 1, calculated before and after the output signal group passes through the isolation circuit module 3.

With no variation found in the output signal group of the ISST target module 1 before and after passing through the isolation circuit module 3, the signal corresponding to the parity calculated before the output signal group passes through the isolation circuit module 3 is to be logically equivalent to the signal calculated thereafter. Thus, it can be inferred from the L-state of the failure alarm signal that the isolation circuit module 3 has no failure.

No logical equivalence found between the signals corresponding to the parity calculated before and after the output signal group passes through the isolation circuit module 3 signifies that the output signal group of the ISST target module 1 has varied before and after passing through the isolation circuit module 3. Thus, it can be inferred from the H-state of the failure alarm signal that the isolation circuit module 3 has a failure.

During the ISST, the isolation control signal is placed in the H-state, so that the first isolation circuits 31 output a signal group having the L-state fixed, in place of the output signal of the ISST target module 1. The second isolation circuit 32 outputs the signals having the L-state fixed, in place of the output signal of the parity encoder 5. The parity decoder 6 can compare the signal corresponding to the parity of the signal group having the L-state fixed output from the first isolation circuits 31, and the signal having the L-state fixed output from the second isolation circuit 32.

With no failure found in the isolation circuit module 3, the parity of the signal group output from the first isolation circuits 31 is to be low and logically equivalent to the signal having the L-state output from the second isolation circuit 32. That is, it can be inferred from the L-state of the failure alarm signal that the isolation circuit module 3 has no failure.

No logical equivalence found between the signal corresponding to the parity of the signal group output from the first isolation circuits 31 and the signal having the L-state output from the second isolation circuit 32 signifies that any of the first isolation circuits 31 or the second solation circuit 32 has a failure. Thus, it can be inferred from the H-state of the failure alarm signal that the isolation circuit module 3 has a failure.

According to the embodiment, as described above, the failure detector circuit 10 can detect a failure in the isolation circuit module 3 in both the first state and the second state of the isolation control signal. That is, the failure detector circuit 10 can constantly detect a failure in the isolation circuit module 3 regardless of execution or non-execution of the ISST.

Specifically, the parity decoder 6 includes an XOR circuit to which the output signal group of the first isolation circuits 31 and the output signal of the second isolation circuit 32 are input. That is, the parity decoder 6 outputs, as the failure alarm signal, a signal corresponding to parity between the output signal group of the first isolation circuits 31 and the output signal of the second isolation circuit 32. Thus, the parity decoder 6 can compare the parity of the output signal group of the first isolation circuits 31 and the output signal of the second isolation circuit 32.

The configuration of the parity decoder 6 is not limited thereto. The parity decoder 6 can be optionally configured as long as the parity decoder 6 can output the failure alarm signal in accordance with a result of the comparison between the signal corresponding to the parity of the output signal group of the first isolation circuits 31 and the output signal of the second isolation circuit 32.

The above has described the example that the first isolation circuits 31 and the second isolation circuit 32 each output a signal having the L-state fixed, in response to the second state of the isolation control signal. However, the state of the output signal of each of the first isolation circuits 31 and the second isolation circuit 32 during the second state of the isolation control signal is not limited to such an example.

The first isolation circuits 31 can be configured, for example, such that in the second state of the isolation control signal, an odd number of first isolation circuits 31 output a third signal having the H-state fixed, and the rest of the first isolation circuits 31 output a third signal having the L-state fixed. In such a case, unless the isolation circuit module 3 has a failure, the parity calculated from a plurality of third signal groups indicates the H-state. Thus, the second isolation circuit 32 can be configured to output a signal having the H-state fixed, for example, in response to the isolation control signal having the H-state.

That is, while the isolation control signal exhibits the second state and the isolation circuit module 3 has no failure, the second isolation circuit 32 may output the signal logically equivalent to the signal corresponding to the parity of the output signal group of the first isolation circuits 31. By such a configuration, the failure alarm signal can be set to the L-state with no failure in the isolation circuit module 3, and the failure alarm signal can be set to the H-state with a possible failure in the isolation circuit module 3, regardless of the first state or the second state of the isolation control signal.

Figure 2:
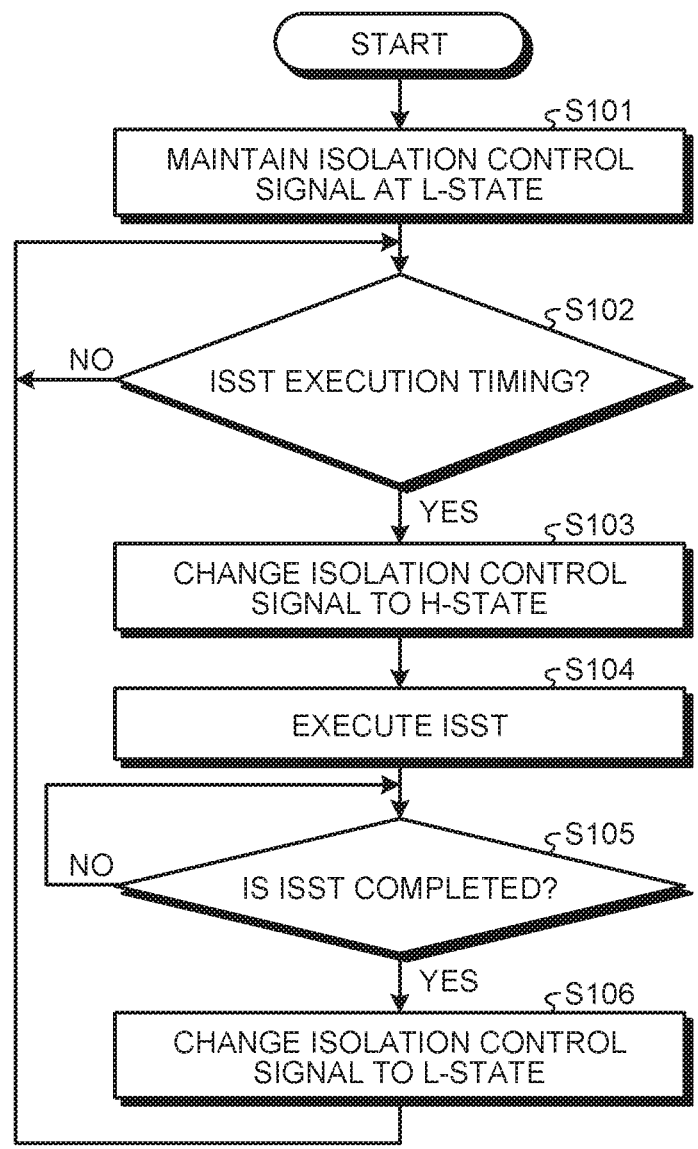
FIG. 2 is a flowchart illustrating an exemplary operation of an in-system self-test (ISST) control circuit of the first embodiment.

FIG. 2 is a flowchart illustrating an exemplary operation of the ISST control circuit 2 according to the first embodiment. For the sake of simple explanation, the operation starts during non-execution of the ISST.

During no execution of the ISST, the ISST control circuit 2 maintains the isolation control signal at the L-state (S101). The ISST control circuit 2 determines whether or not now is the time to start the ISST (S102).

The ISST execution timing can be set optionally. For example, the ISST execution timing may be set to start-up of the system 100. The ISST execution timing may be set in non-operation of the ISST target module 1. Alternatively, the ISST control circuit 2 may be notified of the ISST execution timing from any circuitry (for example, the CPU).

Not at the ISST execution timing (No in S102), the ISST control circuit 2 performs the operation in S102 again. At the ISST execution timing (Yes in S102), the ISST control circuit 2 turns the level of the isolation control signal to the H-state (S103), and executes the ISST (S104).

Then, the ISST control circuit 2 determines whether or not the ISST is completed (S105). While the ISST is not completed (No in S105), that is, during the execution of the ISST, the ISST control circuit 2 performs the operation in S105 again to maintain the isolation control signal at the H-state. Upon completion of the ISST (Yes in S105), the ISST control circuit 2 turns the level of the isolation control signal to the L-state (S106). Then, the ISST control circuit 2 returns to S102.

Figure 3:
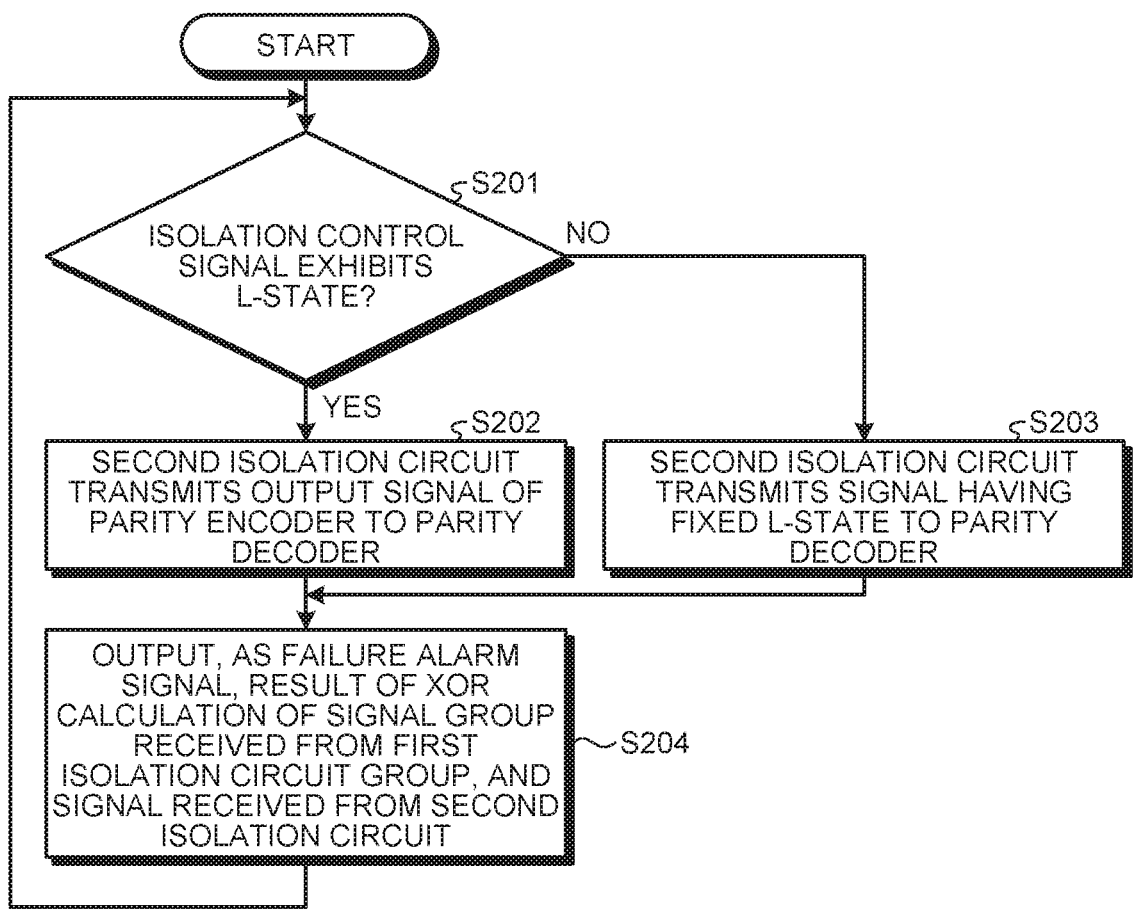
FIG. 3 is a flowchart illustrating an exemplary operation of the failure detector circuit of the first embodiment.

FIG. 3 is a flowchart illustrating an exemplary operation of the failure detector circuit 10 of the first embodiment.

In response to the isolation control signal having the L-state (Yes in S201), the second isolation circuit 32 transmits an output signal of the parity encoder 5 to the parity decoder 6 (S202). In response to the isolation control signal having the H-state (No in S201), the second isolation circuit 32 transmits a signal having the L-state fixed to the parity decoder 6 (S203). After S202 or S203, the parity decoder 6 outputs, as the failure alarm signal, a result of XOR calculation of a signal group acquired from the first isolation circuits 31 and the signal acquired from the second isolation circuit 32 (S204). Then, the second isolation circuit 32 returns to S201.

According to the first embodiment, as described above, the failure detector circuit 10 serves to acquire a signal group (first signal) while transmitted from the ISST target module 1 serving as a first circuit to the isolation circuit module 3 serving as a second circuit and acquires a signal group (second signal) while transmitted from the isolation circuit module 3 to the subsequent-stage module 4 serving as a third circuit. The isolation circuit module 3 represents circuitry that can transmit, to the subsequent-stage module 4, as a second signal, a first signal or a signal group (third signal) having a given fixed state as in place of the first signal. The failure detector circuit 10 outputs a failure alarm signal (fourth signal) indicating detection or non-detection of a failure in the isolation circuit module 3, according to the signal group transmitted from the ISST target module 1 to the isolation circuit module 3 serving as the second circuit and the signal group transmitted from the isolation circuit module 3 to the subsequent-stage module 4 serving as the third circuit.

Thereby, the failure detector circuit 10 can detect a failure in the isolation circuit module 3.

Specifically, the parity encoder 5 calculates parity of the signal group transmitted from the ISST target module 1 to the isolation circuit module 3. The parity decoder 6 calculates parity of the signal group transmitted from the isolation circuit module 3 to the subsequent-stage module 4. The parity decoder 6 outputs the failure alarm signal in accordance with a result of comparison between the two items of parity.

Thereby, the failure detector circuit 10 can detect a failure in the isolation circuit module 3.

Further, according to the first embodiment, the failure detector circuit 10 outputs the failure alarm signal in both of the first state and the second state of the isolation control signal, in accordance with the signal group transmitted from the ISST target module 1 to the isolation circuit module 3, the signal group transmitted from the isolation circuit module 3 to the subsequent-stage module 4, and the isolation control signal.

That is, the failure detector circuit 10 can constantly detect a failure in the isolation circuit module 3 irrespective of execution or non-execution of the ISST.

According to the first embodiment, the parity encoder 5 serving as the fourth circuit outputs a signal (sixth signal) corresponding to the parity of the signal group transmitted from the ISST target module 1 to the isolation circuit module 3. When the isolation control signal exhibits the first state, the second isolation circuit 32 serving as the fifth circuit outputs, as a seventh signal, the signal corresponding to the parity of the signal group transmitted from the ISST target module 1 to the isolation circuit module 3. When the isolation control signal exhibits the second state, the second isolation circuit 32 outputs, as the seventh signal, a signal having a given fixed state. The parity decoder 6 serving as a sixth circuit outputs, as the failure alarm signal, a signal corresponding to parity between the seventh signal and the signal group transmitted from the isolation circuit module 3 to the subsequent-stage module 4 serving as the third circuit.

Thereby, the failure detector circuit 10 can constantly detect a failure in the isolation circuit module 3 irrespective of execution or non-execution of the ISST.

In the first embodiment, the system 100 includes the ISST control circuit 2 that conducts a test (that is, ISST) of the ISST target module 1. During non-execution of the test of the ISST target module 1, the ISST control circuit 2 maintains the isolation control signal at the first state. During the test of the ISST target module 1, the ISST control circuit 2 maintains the isolation control signal at the second state.

Second Embodiment

Figure 4:
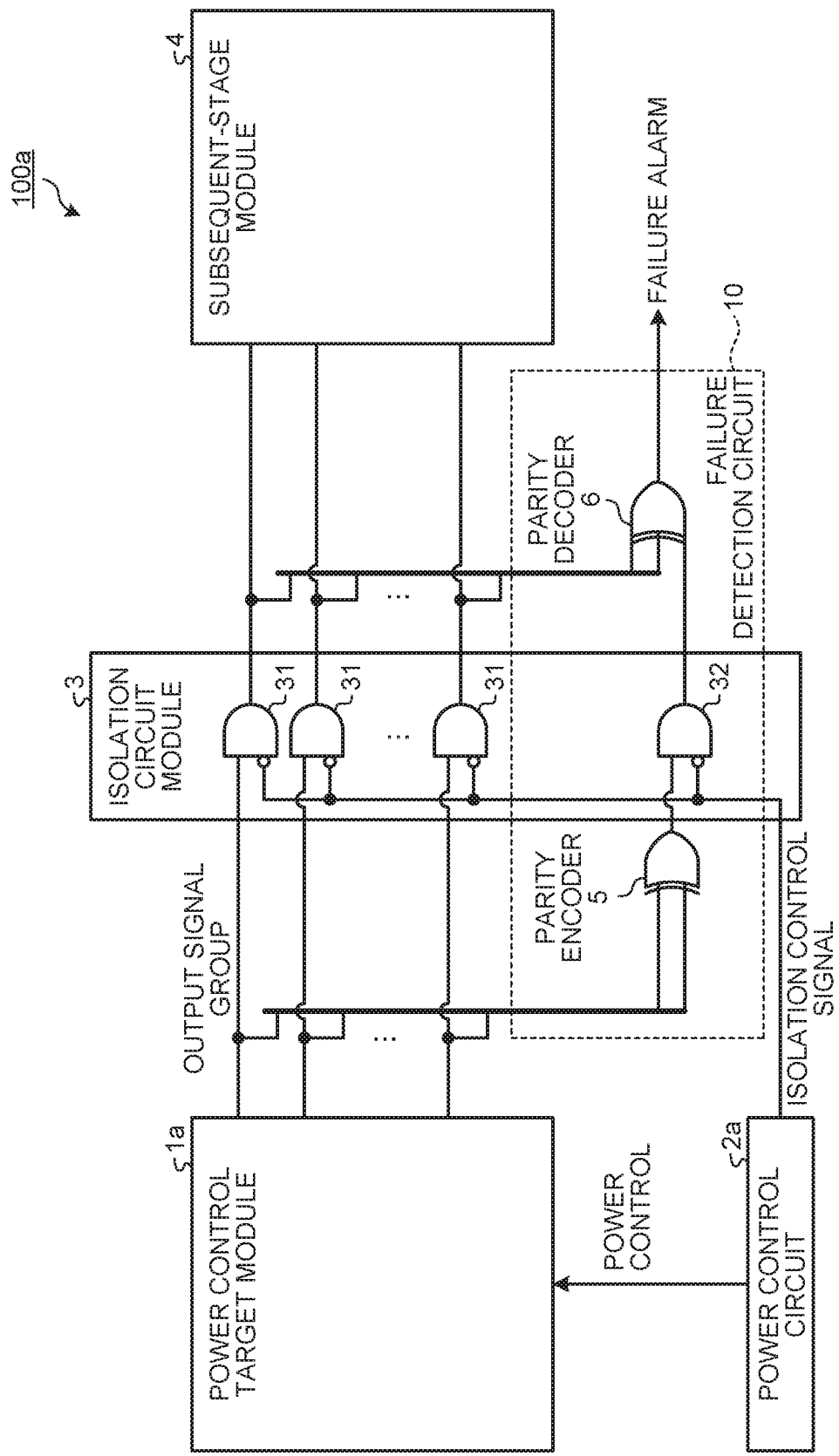
FIG. 4 is a schematic diagram illustrating an exemplary system configuration incorporating a failure detector circuit according to a second embodiment.

FIG. 4 is a schematic diagram illustrating an exemplary system configuration incorporating a failure detector circuit according to a second embodiment. As illustrated in FIG. 4, a system 100a is different from the system 100 of the first embodiment in that the system 100a includes a power control target module 1a and a power control circuit 2a in place of the ISST target module 1 and the ISST control circuit 2.

In the second embodiment, the power control target module 1a corresponds to a first circuit. The power control circuit 2a corresponds to a seventh circuit.

The following will mainly describe different features from the first embodiment, and briefly describe or omit the same features as the first embodiment.

The power control target module 1a is subject to a power-supply interruption control (hereinafter, power control). During non-operation, the power supply to the power control target module 1a may be interrupted. The power control target module 1a is a circuit block such as a system LSI. The power control target module 1a is not limited to such an example. The power control target module 1a can be any circuitry.

The power control circuit 2a implements power control over the power control target module 1a by transmitting a power control signal to the power control target module 1a.

The power control signal may be optionally configured. For example, the power control target module 1a includes a switch that switches between reception and interruption of the power supply. The power control signal serves to turn on or off the switch.

During the interruption of the power supply to the power control target module 1a, the output signal of the power control target module 1a becomes indefinite in level. By receiving an output signal with an indefinite level, a subsequent-stage module 4 may malfunction.

In view of this, while the power supply to the power control target module 1a is being interrupted, an isolation circuit module 3 inputs, to the subsequent-stage module 4, a signal group with a given fixed state to prevent the subsequent-stage module 4 from malfunctioning, in place of an output signal group of the power control target module 1a.

The power control circuit 2a can output an isolation control signal. The power control circuit 2a maintains the isolation control signal at a first state during no interruption of power supply to the power control target module 1a. The power control circuit 2a maintains the isolation control signal at a second state while the power supply to the power control target module 1a is interrupted.

In response to the isolation control signal having the first state, the isolation circuit module 3 transmits, to the subsequent-stage module 4, the output signal group of the power control target module 1a as it is. In response to the isolation control signal having the second state, the isolation circuit module 3 transmits, to the subsequent-stage module 4, a signal group having a given fixed state, in place of the output signal group of the power control target module 1a.

The isolation circuit module 3 includes the same elements as those of the first embodiment. That is, the isolation circuit module 3 includes first isolation circuits 31 corresponding to the output signals of the power control target module 1a, and a second isolation circuit 32.

A parity encoder 5, the second isolation circuit 32, and a parity decoder 6 constitute a failure detector circuit 10 of the second embodiment. The failure detector circuit 10 of the second embodiment is configured similar to that of the first embodiment.

FIG. 5 is a flowchart illustrating an exemplary operation of the power control circuit 2a according to the second embodiment. For the sake of simple explanation, the operation starts during non-interruption of the power supply to the power control target module 1a.

While the power supply to the power control target module 1a is not interrupted, the power control circuit 2a maintains the isolation control signal at the L-state (S301). Then, the power control circuit 2a determines whether or not now is the time to interrupt the power supply to the power control target module 1a (S302).

The power-supply interruption timing can be set optionally. For example, the power control circuit 2a may determine whether or not the power control target module 1a is in operation, and determine the power-supply interruption timing upon a change in the power control target module 1a from an operation state to a non-operation state. Alternatively, the power control circuit 2a may be notified of the power-supply interruption timing from any circuitry (for example, the CPU).

Not at the power-supply interruption timing (No in S302), the power control circuit 2a performs the operation in S302 again. At the power-supply interruption timing (Yes in S302), the power control circuit 2a turns the level of the isolation control signal to the H-state (S303), and interrupts the power supply to the power control target module 1a (S304).

Then, the power control circuit 2a determines whether or not now is the time to resume the power supply (S305).

The power-supply resuming timing can be set optionally. For example, by receipt of an instruction to resume the power supply from optional circuitry (for example, the CPU), the power control circuit 2a can determine that now is the time to resume the power supply.

Not at the power-supply resuming timing (No in S305), the power control circuit 2a performs the operation in S305 again to maintain the isolation control signal at the H-state. At the power-supply resuming timing (Yes in S305), the power control circuit 2a resumes the power supply to the power control target module 1a (S306), and turns the level of the isolation control signal to the L-state (S307). The power control circuit 2a then returns to S302.

The failure detector circuit 10 of the second embodiment performs the same operation as that of the first embodiment. That is, the failure detector circuit 10 of the second embodiment performs the series of operations described with reference to FIG. 3.

Thus, according to the second embodiment, the seventh circuit that outputs the isolation control signal may also serves as the power control circuit 2a that controls the power supply to the power control target module 1a being the first circuit. Specifically, the power control circuit 2a maintains the isolation control signal at the first state during non-interruption of the power supply to the power control target module 1a. The power control circuit 2a maintains the isolation control signal at the second state during the interruption of the power supply to the power control target module 1a.

As described above, according to the first and second embodiments, the failure detector circuit 10 acquires the first signal while transmitted from the first circuit to the second circuit and the second signal while transmitted from the second circuit to the third circuit. The second circuit is located between the first circuit and the third circuit, and serves to transmit, to the third circuit, as the second signal, the first signal or the third signal with a given fixed state in place of the first signal. The failure detector circuit 10 outputs the fourth signal indicating detection or non-detection of a failure in the second circuit, in accordance with the first signal and the second signal.

Thereby, the failure detector circuit 10 can detect a failure in the isolation circuit module 3.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A failure detector circuit that:
    acquires a first signal while transmitted from a first circuit to a second circuit and acquires a second signal while transmitted from the second circuit to a third circuit, the second circuit that is located between the first circuit and the third circuit and transmits, to the third circuit, as the second signal, the first signal or a third signal having a given fixed state, and
    outputs a fourth signal indicating detection or non-detection of a failure in the second circuit, in accordance with the first signal and the second signal.

2. The failure detector circuit according to claim 1, wherein the failure detector circuit:
    calculates parity of the first signal from the first signal,
    calculates parity of the second signal, and
    outputs the fourth signal in accordance with a result of comparison between the parity of the first signal and the parity of the second signal.

3. The failure detector circuit according to claim 1, wherein
    the second circuit acquires a fifth signal and transmits, when the fifth signal exhibits a first state, the first signal to the third circuit as the second signal,
    the second circuit transmits, when the fifth signal exhibits a second state, the third signal to the third circuit as the second signal, and
    in both the first state and the second state of the fifth signal, the failure detector circuit outputs the fourth signal in accordance with the first signal, the second signal, and the fifth signal.

4. The failure detector circuit according to claim 3, comprising:
    a fourth circuit that outputs a sixth signal corresponding to parity of the first signal, in accordance with the first signal;
    a fifth circuit that outputs the sixth signal as a seventh signal when the fifth signal exhibits the first state, and outputs a signal having a given fixed state as the seventh signal when the fifth signal exhibits the second state; and
    a sixth circuit that outputs, as the fourth signal, a signal corresponding parity between the seventh signal and the second signal.

5. The failure detector circuit according to claim 4, wherein the fifth signal is output from a seventh circuit, and
the seventh circuit conducts a test of the first circuit, maintains the fifth signal at the first state while not conducting the test, and maintains the fifth signal at the second state during the test.

6. The failure detector circuit according to claim 4, wherein
the fifth signal is output from a seventh circuit, and
the seventh circuit controls power supply to the first circuit, maintains the fifth signal at the first state while not interrupting the power supply, and maintains the fifth signal at the second state while interrupting the power supply.

7. The failure detector circuit according to claim 3, wherein
the fifth signal is output from a seventh circuit, and
the seventh circuit conducts a test of the first circuit, maintains the fifth signal at the first state while not conducting the test, and maintains the fifth signal at the second state during the test.

8. The failure detector circuit according to claim 3, wherein
the fifth signal is output from a seventh circuit, and
the seventh circuit controls power supply to the first circuit, maintains the fifth signal at the first state while not interrupting the power supply, and maintains the fifth signal at the second state while interrupting the power supply.

9. A failure detection system, comprising:
a first circuit that outputs a first signal;
a second circuit that outputs, as a second signal, the first signal or a third signal having a given fixed state;
a third circuit that operates by the second signal; and
a failure detector circuit that acquires the first signal and the second signal, and outputs a fourth signal indicating detection or non-detection of a failure in the second circuit, in accordance with the first signal and the second signal.

10. The failure detection system according to claim 9, wherein the failure detector circuit:
calculates parity of the first signal from the first signal,
calculates parity of the second signal, and
outputs the fourth signal in accordance with a result of comparison between the parity of the first signal and the parity of the second signal.

11. The failure detection system according to claim 9, wherein
the second circuit acquires a fifth signal and transmits, when the fifth signal exhibits a first state, the first signal to the third circuit as the second signal,
the second circuit transmits, when the fifth signal exhibits a second state, the third signal to the third circuit as the second signal, and
in both the first state and the second state of the fifth signal, the failure detector circuit outputs the fourth signal in accordance with the first signal, the second signal, and the fifth signal.

12. The failure detection system according to claim 11, wherein the failure detector circuit comprises:
a fourth circuit that outputs a sixth signal corresponding to parity of the first signal, in accordance with the first signal;
a fifth circuit that outputs the sixth signal as a seventh signal when the fifth signal exhibits the first state, and outputs a signal having a given fixed state as the seventh signal when the fifth signal exhibits the second state; and a sixth circuit that outputs, as the fourth signal, a signal corresponding parity between the seventh signal and the second signal.

13. The failure detection system according to claim 12, wherein
the fifth signal is output from a seventh circuit, and
the seventh circuit conducts a test of the first circuit, maintains the fifth signal at the first state while not conducting the test, and maintains the fifth signal at the second state during the test.

14. The failure detection system according to claim 12, wherein
the fifth signal is output from a seventh circuit, and
the seventh circuit controls power supply to the first circuit, maintains the fifth signal at the first state while not interrupting the power supply, and maintains the fifth signal at the second state while interrupting the power supply.

15. The failure detection system according to claim 11, wherein
the fifth signal is output from a seventh circuit, and
the seventh circuit conducts a test of the first circuit, maintains the fifth signal at the first state while not conducting the test, and maintains the fifth signal at the second state during the test.

16. The failure detection system according to claim 11, wherein
the fifth signal is output from a seventh circuit, and
the seventh circuit controls power supply to the first circuit, maintains the fifth signal at the first state while not interrupting the power supply, and maintains the fifth signal at the second state while interrupting the power supply.

17. A method comprising:
acquiring a first signal while transmitted from a first circuit to a second circuit and acquiring a second signal while transmitted from the second circuit to a third circuit, the second circuit that is located between the first circuit and the third circuit and transmits, to the third circuit, as the second signal, the first signal or a third signal having a given fixed state; and
outputting a fourth signal indicating detection or non-detection of a failure in the second circuit, in accordance with the first signal and the second signal.

18. The method according to claim 17, further comprising:
calculating parity of the first signal from the first signal;
calculating parity of the second signal; and
outputting the fourth signal in accordance with a result of comparison between the parity of the first signal and the parity of the second signal.

19. The method according to claim 17, further comprising:
acquiring, by the second circuit, a fifth signal and transmitting, when the fifth signal exhibits a first state, the first signal to the third circuit as the second signal,
transmitting, by the second circuit, when the fifth signal exhibits a second state, the third signal to the third circuit as the second signal, and
outputting the fourth signal in accordance with the first signal, the second signal, and the fifth signal in both the first state and the second state of the fifth signal.

20. The method according to claim 19, further comprising:
outputting a sixth signal corresponding to parity of the first signal, in accordance with the first signal;

outputting the sixth signal as a seventh signal when the fifth signal exhibits the first state, and outputs a signal having a given fixed state as the seventh signal when the fifth signal exhibits the second state; and outputting, as the fourth signal, a signal corresponding parity between the seventh signal and the second signal.

* * * * *